United States Patent
Sarin et al.

(10) Patent No.: US 7,835,190 B2
(45) Date of Patent: Nov. 16, 2010

(54) METHODS OF ERASE VERIFICATION FOR A FLASH MEMORY DEVICE

(75) Inventors: Vishal Sarin, Cupertino, CA (US); Dzung Nguyen, Fremont, CA (US); Jonathan Pabustan, San Lorenzo, CA (US); Jung Sheng Hoei, Fremont, CA (US); Jason Guo, San Jose, CA (US); William Saiki, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 12/190,409

(22) Filed: Aug. 12, 2008

(65) Prior Publication Data

US 2010/0039864 A1    Feb. 18, 2010

(51) Int. Cl.
*G11C 11/34*    (2006.01)
(52) U.S. Cl. .......................... 365/185.22; 365/185.29; 365/185.18; 365/185.19
(58) Field of Classification Search ............ 365/185.18, 365/185.19, 185.22, 185.29
See application file for complete search history.

(56) References Cited

U.S. PATENT DOCUMENTS

| | | | |
|---|---|---|---|
| 5,363,334 A | 11/1994 | Alexander et al. | |
| 5,371,709 A | 12/1994 | Fisher et al. | |
| 5,563,824 A | 10/1996 | Miyawaki et al. | |
| 5,671,178 A | 9/1997 | Park et al. | |
| 6,009,014 A | 12/1999 | Hollmer et al. | |
| 6,128,223 A | 10/2000 | Sasai et al. | |
| 6,529,413 B2 | 3/2003 | Lee et al. | |
| 6,907,497 B2 | 6/2005 | Hosono et al. | |
| 7,009,889 B2 * | 3/2006 | Tran et al. | 365/185.29 |
| 7,050,336 B2 * | 5/2006 | Tomoeda et al. | 365/185.29 |
| 7,095,656 B2 | 8/2006 | Lee | |
| 7,117,296 B2 | 10/2006 | Hosono et al. | |
| 7,123,513 B2 | 10/2006 | Chevallier | |
| 7,170,796 B1 * | 1/2007 | He et al. | 365/185.29 |
| 7,221,593 B2 * | 5/2007 | Roohparvar | 365/185.19 |
| 2003/0214853 A1 | 11/2003 | Hosono et al. | |
| 2007/0047327 A1 | 3/2007 | Goda et al. | |

* cited by examiner

*Primary Examiner*—Son Dinh
(74) *Attorney, Agent, or Firm*—Knobbe, Martens, Olson & Bear LLP (57) ABSTRACT

Methods and apparatus are disclosed, such as those involving a flash memory device that includes a memory block. The memory block includes a plurality of data lines extending substantially parallel to one another, and a plurality of memory cells. One such method includes erasing the memory cells; and performing erase verification on the memory cells. The erase verification includes determining one memory cell by one memory cell whether the individual memory cells coupled to one of the data lines have been erased. The method can also include performing a re-erase operation that selectively re-erases unerased memory cells based at least partly on the result of the erase verification.

24 Claims, 7 Drawing Sheets

|     | BL0 | BL1 | BL2 | BL3 |     | BLM-1 | BLM |
|-----|-----|-----|-----|-----|-----|-------|-----|
| WLN   | P | P | P | P | ... | P | P |
| WLN-1 | P | P | P | P | ... | P | P |
| WLN-2 | F | F | F | F | ... | F | F |
| WLN-3 | F | F | F | F | ... | P | P |
| ⋮ | ⋮ | ⋮ | ⋮ | ⋮ | | ⋮ | ⋮ |
| WL1 | P | F | F | P | ... | P | P |
| WL0 | P | P | P | P | ... | P | P |

*FIG. 5A*

|                       | BL0 | BL1 | BL2 | BL3 |     | BLM-1 | BLM |
|-----------------------|-----|-----|-----|-----|-----|-------|-----|
| $V_{WLN} = V_I$       |     |     |     |     | ... |       |     |
| $V_{WLN-1} = V_I$     |     |     |     |     | ... |       |     |
| $V_{WLN-2} = V_E$     |     |     |     |     | ... |       |     |
| $V_{WLN-3} = V_E$     |     |     |     |     | ... |       |     |
| ⋮ | ⋮ | ⋮ | ⋮ | ⋮ | | ⋮ | ⋮ |
| $V_{WL1} = V_I$       |     |     |     |     | ... |       |     |
| $V_{WL0} = V_I$       |     |     |     |     | ... |       |     |

METHODS OF ERASE VERIFICATION FOR A FLASH MEMORY DEVICE

BACKGROUND

1. Field of the Invention

Embodiments of the invention relate to memory devices, and more particularly, in one or more embodiments, to flash memory devices.

2. Description of the Related Art

Flash memory devices are non-volatile memory devices which store information on a semiconductor in a way that needs no power to maintain the information stored therein. Flash memory devices have been widely used as mass-storage devices because of their high storage densities and low costs.

Figure 1:
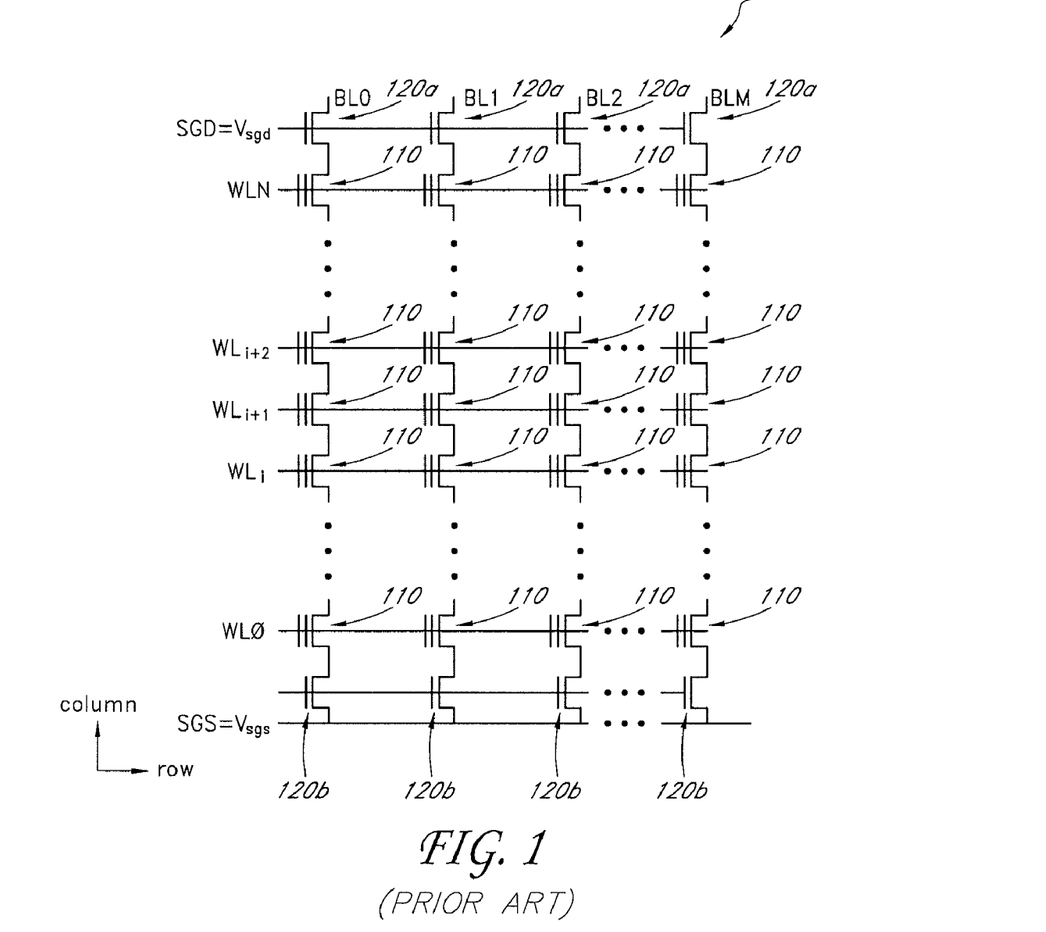
FIG. 1 is a schematic diagram of a memory block of a conventional NAND flash memory device.

Referring to FIG. 1, a conventional NAND flash memory device includes a memory block 100. The illustrated memory block 100 includes a plurality of memory cells arranged in a matrix form. The memory block 100 also includes first to m-th data lines, such as bit lines BL0-BLM, and first to n-th access lines, such as word lines WL0-WLN. In some arrangements, m can be 32,767 or 65,535, and n can be 32 or 64. The bit lines BL0-BLM extend parallel to one another in a column direction. The word lines WL0-WLN extend parallel to one another in a row direction perpendicular to the column direction. The memory block 100 also includes upper and lower bit line select transistors 120a, 120b for selecting the memory block 100.

Each bit line includes a string of memory cells 110. For example, the second bit line BL1 is coupled to memory cells 110 connected in series. Each of the memory cells 110 includes a floating gate transistor. The floating gate transistors are coupled to one another in series from source to drain. The control gates of the floating gate transistors of the memory cells 110 of a common row are coupled to the same word line (in certain arrangements, the control gates and portions of the word lines can be the same structure). Each of the memory cells 110 stores a charge (or a lack of charge). The amount of stored charge can be used to represent, for example, one or more states, which can represent one or more digits (for example, bits) of data. The memory cells 110 can be either a single-level cell (SLC) or a multi-level cell (MLC). A charge stored in a floating gate transistor sets the threshold voltage of the floating gate transistor. Thus, the amount of a charge in the floating gate transistor of a memory cell 110 may be determined by sensing the threshold voltage of the floating gate transistor.

Figure 2:
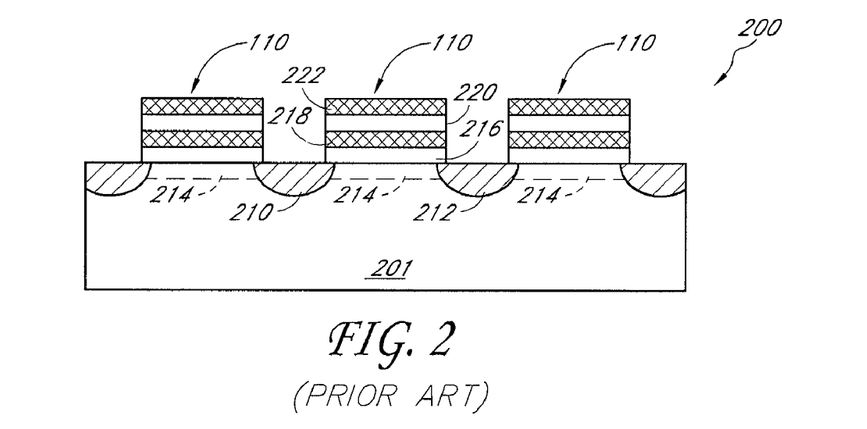
FIG. 2 is a schematic cross-section of the memory block of the conventional NAND flash memory device of FIG. 1.

FIG. 2 illustrates a cross-section of the floating gate transistors of the memory cells 110 in the second bit line BL1. The floating gate transistors are formed on a substrate 201. Each of the floating gate transistors includes a source region 210 (which can be a drain region for a neighboring transistor of the same bit line), a drain region 212 (which can be a source region for a neighboring transistor of the same bit line), a doped channel region 214, a first dielectric 216 (for example, a tunnel oxide), a floating gate 218, a second dielectric 220 (for example, a gate oxide, wherein the tunnel and gate oxide can be formed of the same or different material), and a control gate/word line 222. The first dielectric 216 is formed on the channel region 214 to insulate the floating gate 218 from the channel region 214. The second dielectric 220 physically and electrically separates the floating gate 218 from the control gate 222. The control gate 222 is coupled to (e.g., forms) an appropriate word line, for example, word line WL1. Electrons can be trapped on the floating gate 218 and be used to store data.

During a write operation of the NAND flash memory device, data is typically written on a group of memory cells coupled to a single word line. Such a group of memory cells can be referred to as a "page." In one arrangement, a page may include all memory cells coupled to a word line. In other arrangements, a page may be formed by every other memory cells coupled to a single word line. In certain arrangements, a page may be formed by every fourth memory cells coupled to a single word line. It will be understood that a page may be formed by any suitable selected number of memory cells coupled to a word line.

In certain instances, memory cells in a block are erased to have the same data as one another. Typically, an erase operation is performed on a block basis. For example, each of single-level memory cells in a memory block can store a data bit, either "0" or "1," in a programmed state. Ideally, all of the memory cells may have 1's in an erased state. Similarly, each of multi-level memory cells in a memory block may store one of multiple data values, for example, 11, 01, 10, 11 in four-level cells in a programmed state. Ideally, all of the multi-level memory cells may have, for example, "11" in an erased state.

However, in practice, some of memory cells in a memory block may not be fully erased after an erase operation. Such memory cells adversely affect the accuracy of data stored in the memory cells. Thus, NAND flash memory devices typically use an erase verification scheme after an erase operation to determine if there are unerased memory cells. If there are unerased memory cells, the entire memory block may be re-erased.

Figure 3A:
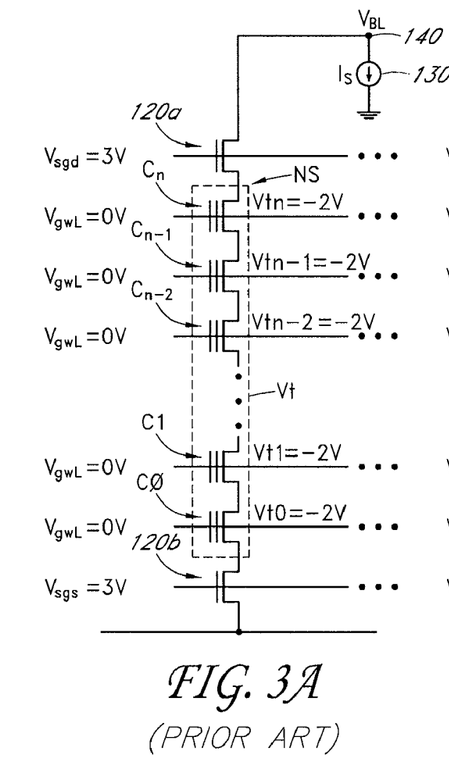
FIGS. 3A to 3C illustrate a conventional erase verification method for a NAND flash memory device.

Referring to FIG. 3A, a conventional erase-verification method will be described in the following. FIG. 3A illustrates a portion of a NAND flash memory device. The portion includes a string of memory cells C0-Cn coupled to a bit line (hereinafter, referred to as a NAND string NS), upper and lower bit line select transistors 120a, 120b, and a current source 130. In the method, the whole NAND string NS is erase-verified at a time. The gates of the upper and lower bit line select transistors 120a, 120b are provided with $V_{sgd}$ and $V_{sgs}$, respectively, and the gates of all the memory cells C0-Cn are provided with a word line voltage $V_{gWL}$. For example, each of $V_{sgd}$ and $V_{sgs}$ is about 3 V and $V_{gWL}$ is about 0 V. By applying 3 V to the bit line select transistors 120a, 120b, the bit line select transistors 120a, 120b are fully turned on.

Figure 3B:
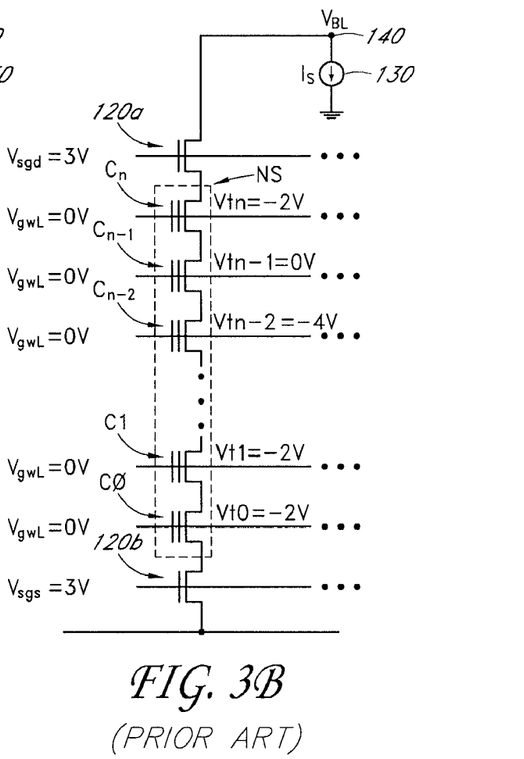
Figure 3C:
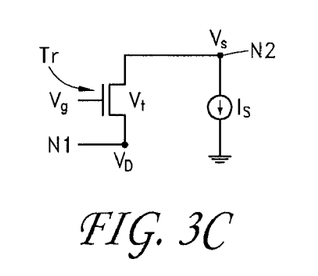

The resulting circuit formed by the NAND string NS and the current source 130 is a source-follower circuit. A typical source-follower circuit, as shown in FIG. 3C, includes a transistor Tr and a current source Is. The relationship between voltages at nodes in the source-follower circuit is represented by Equation 1 below.

$$Vs = Vg - Vt \quad (1)$$

In Equation 1, Vs is the source voltage of the transistor Tr, Vg is the gate voltage of the transistor Tr, and Vt is the threshold voltage of the transistor Tr. $V_D$ is the drain voltage of the transistor Tr. Similarly, in the circuit formed by the NAND string NS and the current source 130 shown in FIG. 3A, the relationship between voltages at nodes in the circuit can be represented by Equation 2 below:

$$V_{BL} = V_{gWL} - Vt \quad (2)$$

In Equation 2, $V_{BL}$ is a voltage level at a node 140 between the upper bit line select transistor 120a and the current source 130. Vt is an average threshold voltage of the memory cells C0-Cn of the NAND string NS. Because $V_{gWL}$ is set to 0 V in FIG. 3A, the average threshold voltage Vt can be determined by detecting the voltage level $V_{BL}$ at the node 140.

If substantially all of the memory cells C0-Cn of the NAND string NS have the same threshold voltage (for example, −2 V), as shown in FIG. 3A, the average threshold voltage Vt will correctly reflect the status of the memory cells. However, in practice, the average threshold voltage Vt may not fully reflect individual memory cells' status. Thus, there can be unerased cells in the NAND string NS even if the average threshold voltage Vt indicates that all the memory cells have been erased. For example, as shown in FIG. 3B, there can be unerased memory cells (for example, Cn−1 in FIG. 3B), but the average threshold voltage Vt may nevertheless indicate that all the memory cells have been fully erased.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

As described above, the conventional method of FIGS. 3A and 3B may not accurately provide the status of individual memory cells in a NAND string. That is, there can be unerased cells in the NAND string NS even if the erase verification result indicates that all the memory cells have been erased.

In addition, the conventional method may produce a wide distribution of threshold voltages in erased memory cells. The conventional method only provides an average threshold voltage of the memory cells coupled to a bit line, but cannot detect individual memory cells' threshold voltage levels. Thus, when the erase verification result indicates that a bit line has failed the erase verification, there can be some memory cells that have been already erased (that is, some memory cells can have a first erase threshold voltage, for example, −2V, indicating an erased state). However, because a re-erase operation is performed on a block basis, the already erased memory cells are also subjected to the re-erase operation. Thus, the already erased memory cells may be over-erased, and have a second erase threshold voltage (for example, −4 V) that is lower than the first erase threshold voltage. The re-erase operation, however, would only reduce the threshold voltages of unerased memory cells to the first erase threshold voltage (for example, −2 V). Thus, the memory block may have a wide distribution of erase threshold voltages in erased memory cells.

In a memory block having a wide distribution of erase threshold voltages, when programming, memory cells that are over-erased are subjected to a high threshold voltage increase than those that are not over-erased. Such a high increase in the threshold level may shorten the life of the memory cells, thereby reducing the life of the memory block. Furthermore, memory cells that have been already erased may be subjected to unnecessary re-erase operations. Such operations increase the overall number of erase operations on the memory cells, which may adversely affect the life of the memory cells. Therefore, there is a need for a scheme that can provide an accurate erase-verification while narrowing the distribution of threshold voltage levels of erased memory cells by preventing over-erasure of memory cells.

In one embodiment, memory cells of a memory block in a NAND flash memory device are erased. Subsequently, memory cells on a NAND string are individually erase-verified one by one during erase verification. In some embodiments, while memory cells on a NAND string are erase-verified one by one, memory cells coupled to a word line may be simultaneously erase-verified. In other embodiments, memory cells of a page may be simultaneously erase-verified. In this manner, at least part or all of the memory cells on a memory block are erase-verified.

For a re-erase operation after the erase verification, it is determined whether a number of unerased memory cells on each word line exceeds a threshold number. If the number does not exceed the threshold number, the word line is provided with an inhibition voltage during the re-erase operation. The inhibition voltage prevents the memory cells coupled to the word line from being further erased during the re-erase operation. The memory cells coupled to the other word lines in the memory block are erased by the re-erase operation. In this manner, a portion of the memory block can be erased by the re-erase operation. In the embodiments described below, the term "memory block" may refer to the smallest erasable unit for an erase operation. The re-erase operation may re-erase an entire memory block or a portion of the memory block.

Figure 4A:
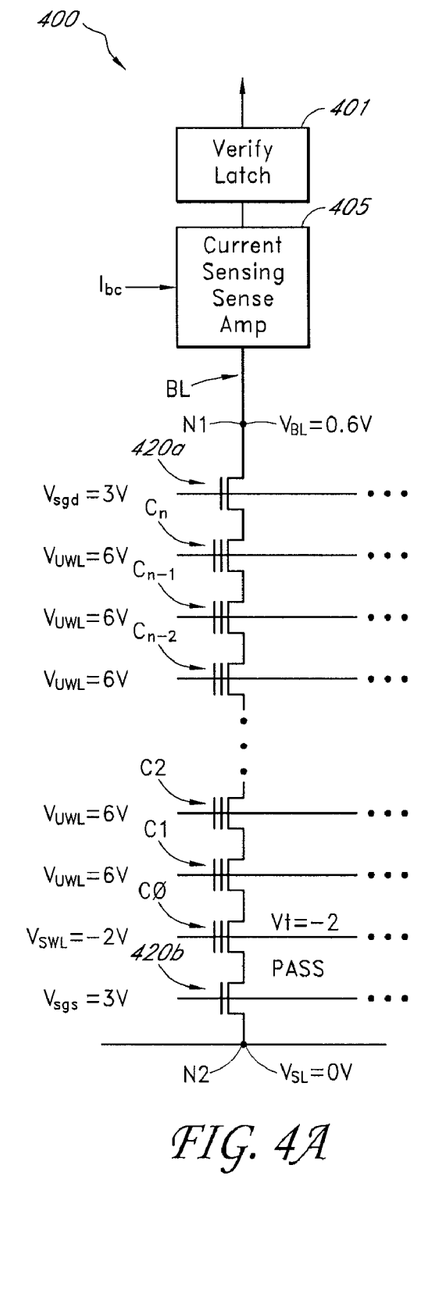
FIGS. 4A and 4B illustrate an erase verification method for a NAND flash memory device according to one embodiment.
Figure 4B:
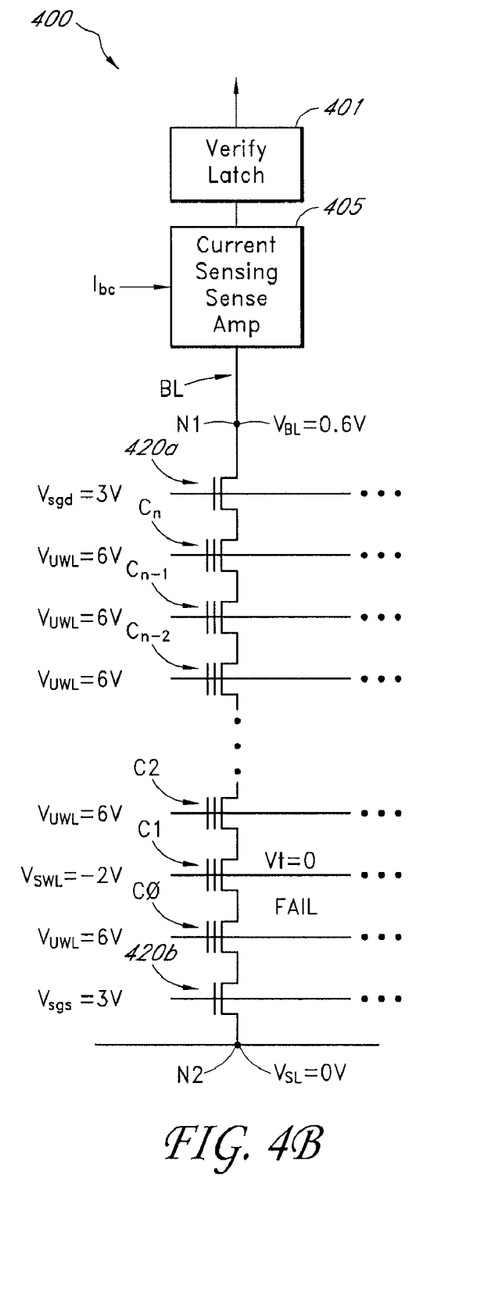

Referring to FIGS. 4A and 4B, a method of erase verification for a NAND flash memory device according to one embodiment will be described below. The illustrated portion of a NAND flash memory device 400 includes a verify latch 401, a current-sensing sense amplifier 405, a bit line BL, memory cells C0-Cn coupled to the bit line BL, and upper and lower bit line select transistors 420a, 420b. The portion also includes a first node N1 on the bit line BL between the current-sensing sense amplifier 405 and the upper bit line select transistor 420a, and a second node N2 at the drain of the lower bit line select transistor 420b.

The verify latch 401 and the sense amplifier 405 may also be used for read operations for the NAND flash memory device 400. The configurations of the bit line BL, the memory cells C0-Cn, and the upper and lower bit line select transistors 420a, 420b can be as described above in connection with FIGS. 1 and 2.

During an erase verification operation, the first node N1 on the bit line BL can be charged to a selected voltage. In one embodiment, a bit line voltage $V_{BL}$ at the first node N1 can be increased to about 0.6 V. It will be appreciated that the bit line voltage $V_{BL}$ can vary widely, depending on the design of the NAND flash memory device. A source line voltage $V_{SL}$ is provided to the second node N2 of the bit line BL. In one embodiment, the source line voltage $V_{SL}$ can be about 0 V. It will be appreciated that the source line voltage $V_{SL}$ can vary widely depending on the design of the NAND flash memory device. In addition, a biasing current $I_{bc}$ is provided to the current-sensing sense amplifier 405. In one embodiment, the biasing current $I_{bc}$ is about 100 nanoamperes (nA), but it will be appreciated that the biasing current $I_{bc}$ can vary widely depending on the design of the NAND flash memory device.

In addition, the gates of the upper and lower bit line select transistors 420a, 420b are provided with $V_{sgd}$ and $V_{sgs}$, respectively (for example, about 3 V) to fully turn on the transistors 420a, 420b. Except for a memory cell being subjected to erase verification, the gates of all the other memory cells are provided with an unselect word line voltage $V_{UWL}$ (for example, about 6 V) to fully turn on the transistors of the memory cells. Thus, the bit line select transistors 420a, 420b and the memory cells (except for the memory cell being erase-verified) form substantially conductive electrical paths.

The gate of the memory cell that is being erase-verified is provided with a select word line voltage $V_{SWL}$ that is substantially equal to a desired threshold voltage Vtd (for example, −2 V) that an erased memory cell would have. If the actual threshold voltage Vta of the erase-verified memory cell is the same as or lower than the desired threshold voltage Vtd (that is, the memory cell has been fully erased), the transistor of the memory cell would be turned on by the select word line voltage $V_{SWL}$ supplied to the gate of the transistor. Thus, a current can flow through the memory cell, and can be detected by the sense amplifier 405. By contrast, if the actual threshold voltage Vta of the memory cell is higher than the desired threshold voltage Vtd, the transistor of the memory cell would not be turned on, and thus no current will be detected by the sense amplifier 405.

For example, in FIG. 4A, a first memory cell C0 is erase-verified by applying −2 V to the gate of the memory cell C0 and 6 V to the gates of all the other memory cells C1-Cn. The sense amplifier 405 detects a current flowing through the bit line BL. If the detected current is equal to or greater than the biasing current $I_{bc}$ provided to the current-sensing sense amplifier 405, it indicates that the actual threshold voltage Vta of the first memory cell C0 is the same as or lower than about −2 V, that is, the memory cell has been erased. On the contrary, if the detected current is smaller than the biasing current, it indicates that the actual threshold voltage Vta of the first memory cell C0 is higher than about −2 V, that is, the memory cell has not been erased.

Subsequently, as shown in FIG. 4B, a second memory cell C1 immediately above the first memory cell C0 is erase-verified by applying about −2 V to the second memory cell C1 and 6 V to all the other memory cells C0 and C2-Cn. If the sense amplifier 405 detects no current flowing through the bit line BL, it indicates that the threshold voltage of the second memory cell C1 is higher than about −2 V, that is, the memory cell has not been erased. In this manner, each memory cell coupled to the bit line BL is erase-verified one by one from the bottom to the top or vice versa. A skilled artisan will appreciate that the sequence of the erase verification on the memory cells coupled to a bit line can vary widely depending on the erase verification schemes.

In FIGS. 4A and 4B, one bit line and memory cells coupled to the bit line are shown, and the memory cells coupled to the bit line are erase-verified one by one. Thus, the erase verification process can include a plurality of erase verification steps for the respective memory cells. In some embodiments, each of such erase verification steps can be simultaneously performed on all the memory cells coupled to a word line. In other embodiments, each of such erase verification steps can be performed simultaneously on memory cells of one page. For example, every two, four, or eight memory cells coupled to a word line can be subjected to an erase verification step at the same time.

Information on whether each of the memory cells has been successfully erased ("passed") can be temporarily stored in the verify latch 401. The information may be transferred to storage (for example, a register) for a subsequent re-erase operation for providing erase inhibition which will be described later in detail.

Figure 5A:
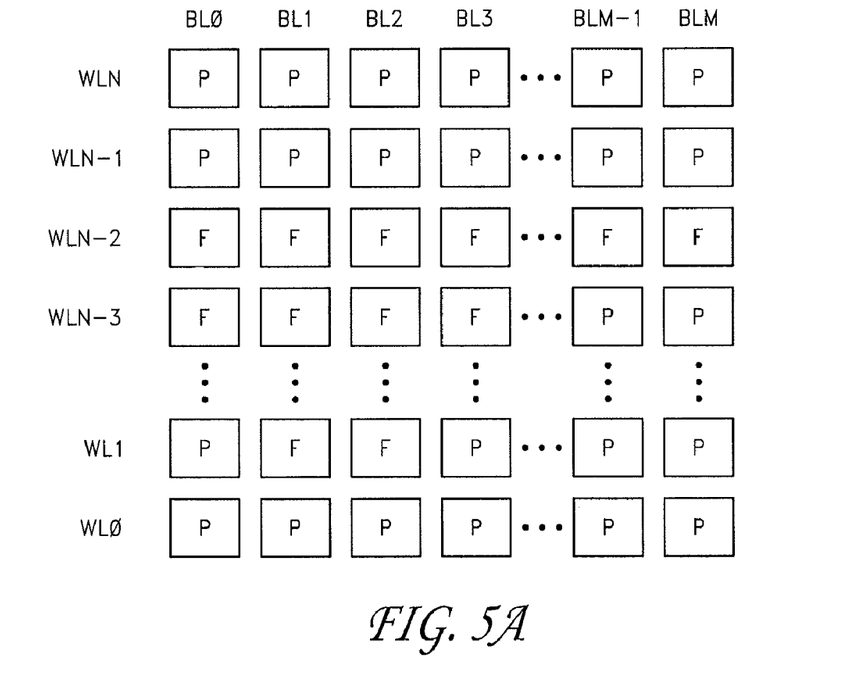
FIGS. 5A and 5B illustrate a method of erase inhibition for erased memory cells in a NAND flash memory device according to one embodiment.

In one embodiment, the storage can have information on whether each of the memory cells in a memory block has passed or failed erase verification, as shown in FIG. 5A. In FIG. 5A, the boxes represent memory cells, and the letters in the boxes indicate whether the memory cells have passed (P) or failed (F) the erase verification described above in connection with FIGS. 4A and 4B. A row of memory cells are those memory cells coupled to a respective one of word lines WL0-WLN. A column of memory cells are those memory cells coupled to a respective one of bit lines BL0-BLM. In other embodiments, the storage can have information on whether any of the word lines needs erase inhibition, based at least partly on the number of passed or failed memory cells coupled to the word line.

Figure 5B:
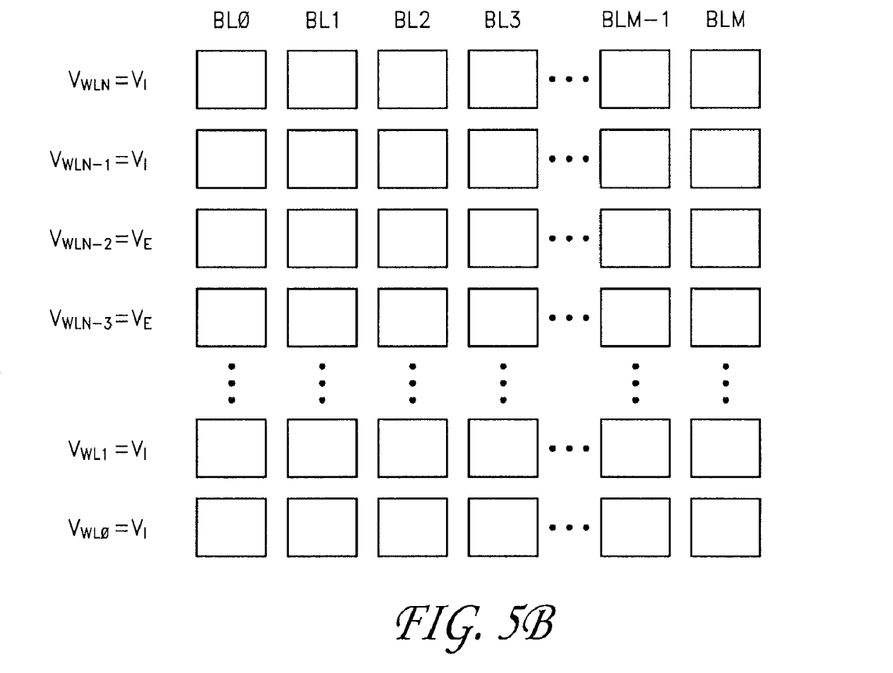

Referring to FIGS. 5A and 5B, a method of erase inhibition of already erased memory cells according to one embodiment will be described in the following. First, it is determined whether each of the word lines in a memory block needs erase inhibition. For example, this can be performed by determining whether the number of unerased memory cells (those that have failed the erase verification) coupled to a word line is equal to or greater than a threshold number. Alternatively, this can be performed by determining whether a number of erased memory cells (those that have passed the erase verification) coupled to a word line is equal to or greater than a threshold number. In other embodiments, whether to perform erase inhibition can be determined on a page basis, instead of on a word line basis.

Referring back to the example of FIG. 5A, all memory cells coupled to a first word line WL0, an (N−1)-th word line WLN-1, and an N-th word line WLN have passed erase verification (for example, these memory cells have a threshold voltage of about −2 V or lower). On the other hand, all memory cells coupled to an (N−2)-th word line WLN-2 have failed erase verification (for example, these memory cells have a threshold voltage greater than about −2 V). Some of memory cells coupled to an (N−3)-th word line WLN-3 and a second word line WL1 have failed erase verification while other memory cells coupled to the word lines WLN-3 and WL1 have passed erase verification.

For example, the threshold number for unerased memory cells coupled to a word line can be set to 2. With this threshold number, the first word line WL0, the second word line WL1, the (N−1)-th word line WLN-1, and the N-th word line WLN collectively pass erase verification. However, the (N−3)-th word line WLN-3 and the (N−2)-th word line WLN-2 collectively fail erase verification.

Subsequently, a re-erase operation is performed on the entire memory block. During the re-erase operation, an inhibit voltage $V_I$ (for example, about 5 V) is applied to word lines that have passed erase verification while an erase voltage $V_E$ (for example, about 0 V) is applied to the other word lines, as shown in FIG. 5B. At the same time, a substrate voltage Vs (for example, about 20 V) for the re-erase operation is applied to the substrate of the memory block for all the memory cells therein. Thus, memory cells coupled to a word line experience a voltage difference between the substrate voltage Vs and a voltage applied to the word line (either $V_I$ or $V_E$). A voltage difference between the substrate voltage Vs and the erase voltage $V_E$ is sufficient for erasing memory cells coupled to a word line to which the erase voltage $V_E$ is applied. On the other hand, a voltage difference between the substrate voltage Vs and the inhibition voltage $V_I$ is not sufficient for erasing memory cells coupled to a word line to which the inhibition voltage $V_I$ is applied. Thus, by applying the inhibit voltage $V_I$ to selected word lines, all the memory cells coupled to the selected word lines would not be re-erased, and can retain the same threshold voltage, for example −2V for erased memory cells, as before the re-erase operation.

However, other memory cells coupled to word lines to which the erase voltage $V_E$ is applied are substantially fully erased. That is, the threshold voltages of the other memory cells can be lowered to, for example −2V, by the re-erase operation. Thus, substantially all of the memory cells in the memory block should have substantially the same threshold voltage as one another after the re-erase operation.

In the embodiment described above, the threshold number used for unerased memory cells is non-zero. Thus, after the re-erase operation, there can still be unerased memory cells coupled to a word line that has collectively passed erase verification, but includes unerased memory cells. In addition, there can be over-erased memory cells coupled to a word line that has not passed erase verification, but includes erased memory cells. Some degree of error is tolerable because of error correction coding (ECC). A skilled artisan will readily be able to select a suitable threshold number for unerased or erased memory cells, depending on the memory devices' design and life expectancy.

Figure 6:
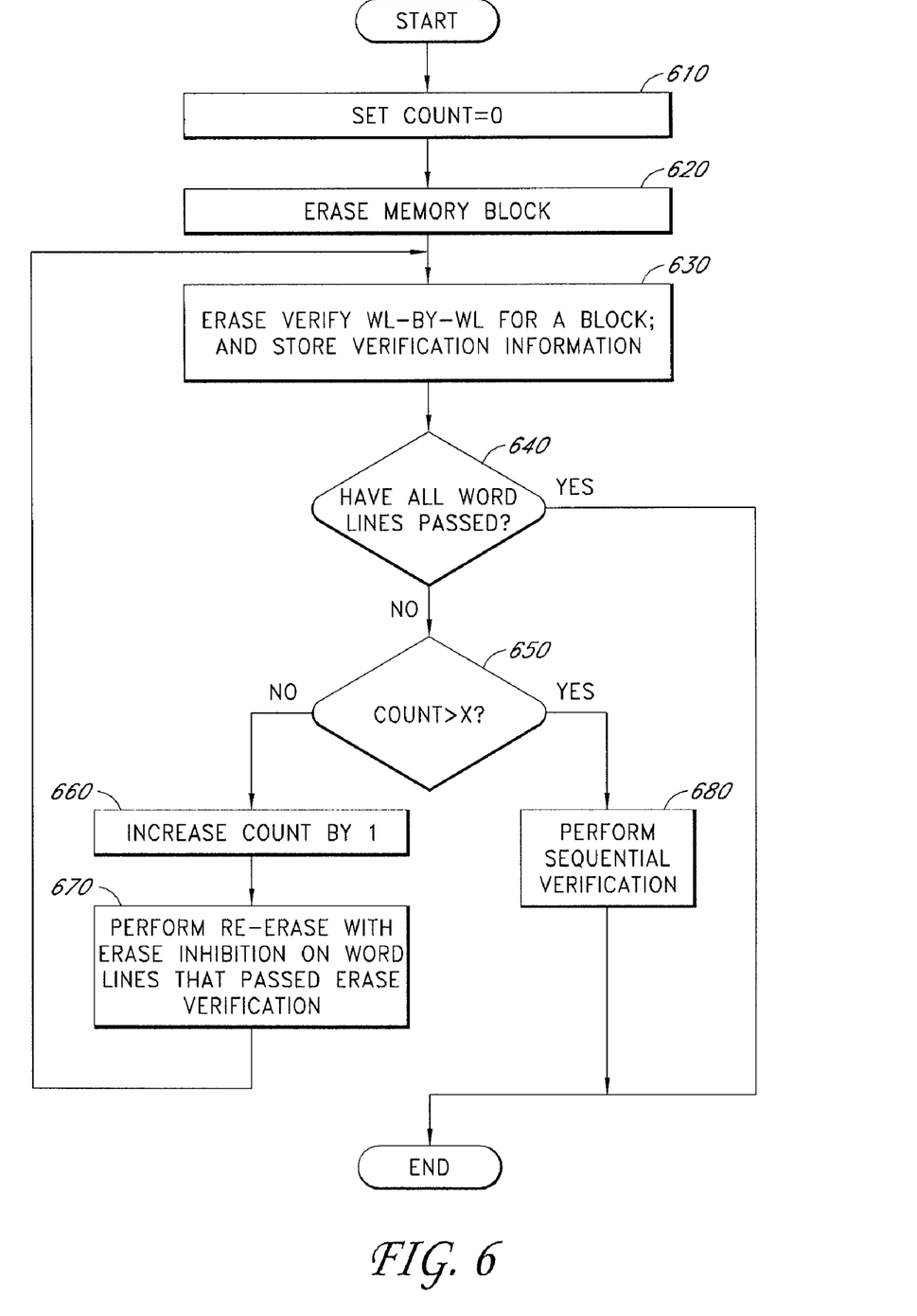
FIG. 6 is a flowchart illustrating a method of operating a NAND flash memory device according to one embodiment.

Referring to FIG. 6, a process of operating a NAND flash memory device according to one embodiment will be described below. At the block 610, a count of performed erase verification processes is set to "0." At the block 620, an erase operation is performed on a memory block. At the block 630, memory cells in the memory block is erase-verified word line by word line, as described above with respect to FIGS. 4A and 4B. The information on the erase-verification is stored in storage, as shown in, for example, FIG. 5A.

At the decision block 640, it is determined if all the word lines have passed erase verification, as described earlier in connection with FIG. 5A. If yes, the process is terminated. If no, it is determined at the decision block 650 whether the count is greater than a selected number X, where X can be an integer selected from 0 to 16. A skilled artisan will appreciate the selected number can vary widely depending on the design of the NAND flash memory device.

If no, the count is increased by one at block 660. Then, a re-erase operation is performed on the memory block at block 670, as described above with respect to FIG. 5B. After the completion of the re-erase process, the process returns to block 630.

If yes at the decision block 650, a sequential verification process is performed at block 680. The sequential verification process will be described in detail later. A skilled artisan will appreciate that at least one of the blocks can be omitted or two or more blocks can be combined with each other. In addition, any suitable additional blocks can be added to the process described above.

Figure 7:
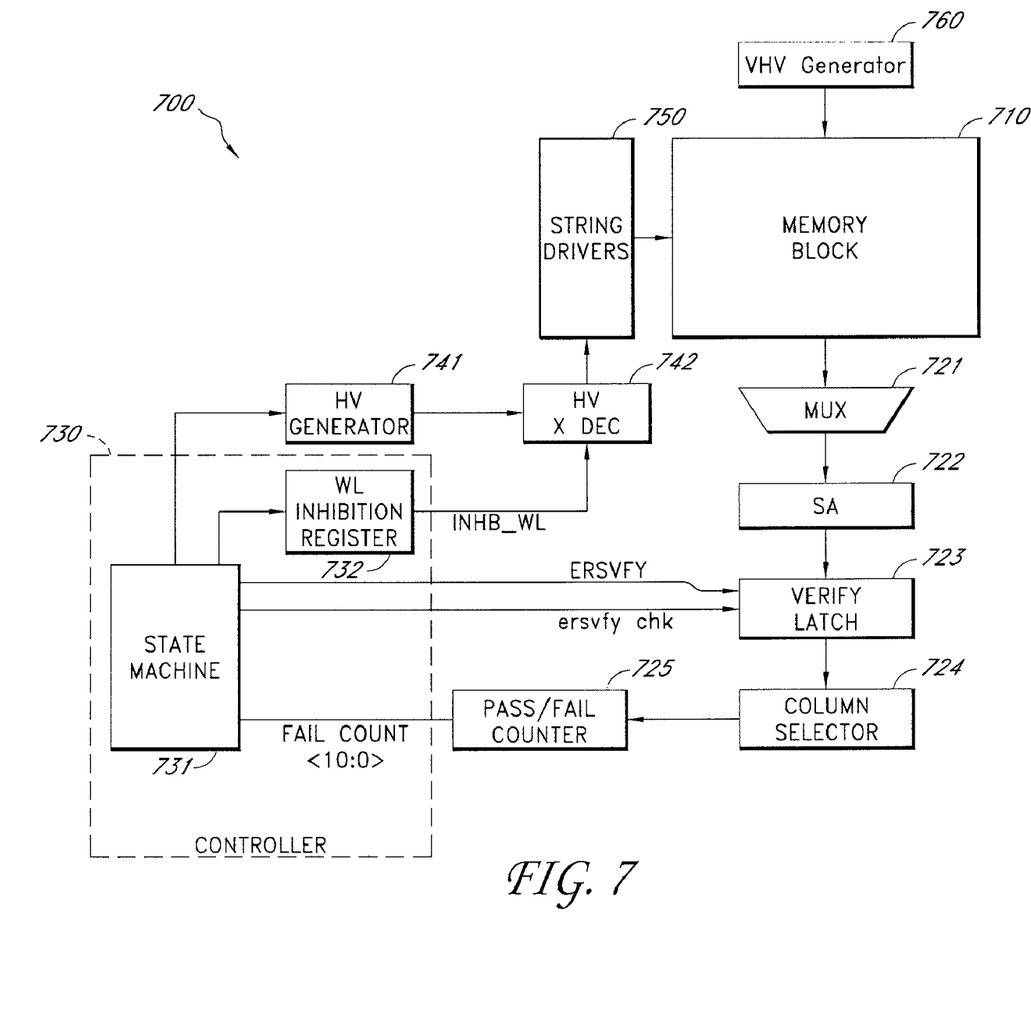
FIG. 7 is a schematic block diagram of a NAND flash memory device employing an erase verification/inhibition scheme according to one embodiment.

Referring to FIG. 7, one embodiment of a NAND flash memory device employing an erase verification/inhibition scheme will be described below. The illustrated NAND flash memory device 700 includes a memory block 710, a multiplexer block 721, a current-sensing sense amplifier 722, a verify latch 723, a column selector 724, a pass/fail counter 725, a controller 730, a high voltage (HV) generator 741, a high voltage (HV) x-line decoder (Xdec) 742, string drivers 750, and a very high voltage (VHV) generator 760. At least one of the multiplexer block 721, the current-sensing sense amplifier 722, the verify latch 723, the column selector 724, the pass/fail counter 725, the controller 730, the high voltage (HV) generator 741, the high voltage (HV) x-line decoder (Xdec) 742, the string drivers 750, and the very high voltage (VHV) generator 760 forms a block erase circuit.

The memory block 710 can include word lines, bit lines, and memory cells. In the illustrated embodiment, the memory block 710 includes 32 word lines and 32 bit lines. The details of memory blocks can be as described above in connection of FIGS. 1 and 2. A skilled artisan will appreciate that the numbers of the word lines and bit lines vary widely depending on the design of the memory block 710.

The multiplexer block 721 is configured to selectively output currents from the bit lines in the memory block 710. In the illustrated embodiment, the erase verification is performed on a page basis, and a word line has four pages. The illustrated multiplexer block 721 includes 4:1 multiplexers, and outputs currents from a page of a word line at a time. That is, four bit lines share a multiplexer, and for 32 bit lines, the multiplexer block 721 can include 8 multiplexers. The multiplexer block 721 allows the bit lines to share the sense amplifier 722 such that the sense amplifier 722 detects currents from the bit lines of a page at a time. In other embodiments, the configuration and the number of the multiplexers may vary widely, depending on the number of bit lines and erase verification schemes. In certain embodiments where a whole word line is erase-verified at the same time, the multiplexer block 721 can be omitted. The multiplexer block 721 may also control a bit line biasing current (for example, $I_{bc}$ of FIGS. 4A and 4B) supplied to the sense amplifier 722 during an erase verification operation. The multiplexer block 721 may also be used for a read operation.

The current-sensing sense amplifier 722 is configured to detect currents flowing from the bit lines of the memory block 710 via the multiplexer block 721 during the erase verification operation. The sense amplifier 722 provides signals SAOUTB indicative of the levels of the detected currents to the verify latch 723. In other embodiments, the sense amplifier 722 can also be used for a read operation and/or program verification operation.

The verify latch 723 stores the levels of the detected currents provided by the sense amplifier 722. The verify latch 723 also converts the detected current levels (analog signals) to one or more digital signals PFVL (either a "high" or "low" signal) indicative of whether the memory cells have passed or failed erase verification. For example, if a memory cell has passed erase verification, the digital signal PFVL may be at a "high" level. By contrast, if the memory cell has failed erase verification, the digital signal PFVL may be at a "low" level. The verify latch 723 provides such digital signals PFVL to the column selector 724. In the illustrated embodiment where each page includes 8 bit lines, the verify latch 723 may provide 8 digital signals PFVL for each page to the column selector 724.

The column selector 724 receives the digital signals PFVL from the verify latch 723. The column selector 724 provides the digital signals PFVL one by one to the pass/fail counter 725 by selecting one of the digital signals PFVL at a time.

The pass/fail counter 725 is configured to count the number of passed or failed memory cells for each of the word lines, based at least partly on the digital signals PFVL from the column selector 724. The pass/fail counter 725 provides a fail count signal FAIL_COUNT to the controller 730 for each of the word lines.

The controller 730 is configured to control the overall operation of the NAND flash memory device 700, including erase verification and re-erase operations on the memory block 710. The illustrated controller 730 includes a state machine 731 and a word line inhibition register 732.

The state machine 731 is configured to determine which word line needs to be erase-inhibited, based at least partly on the fail count signal FAIL_COUNT from the pass/fail counter 725. The state machine 731 provides the HV generator 741 with a first control signal to activate the HV generator 741. The state machine 731 also provides the word line inhibition register 732 with information on which word line needs to be erase-inhibited. In addition, the state machine 731 provides the verify latch 723 with an erase-verify signal ERSVFY to enable the verify latch 723. The state machine 731 also provides the verify latch 723 with an erase verify check signal ersvfy chk to clear the stored current values for erase verification for a next page or word line.

The word line inhibition register 732 is configured to store information on which word line needs to be erase-inhibited, and provide the HV x-line decoder 742 with a second control signal including the information. The word line inhibition register 732 may include an N number of registers, where N is a total number of the word lines in the memory block 710.

The high voltage (HV) generator 741 is configured to generate a relatively high voltage to be supplied to the word lines of the memory block 710. In one embodiment, the high voltage may be +5V which can serve as an inhibition voltage for a re-erase operation, as described above in connection with FIG. 5B.

The high voltage (HV) x-line decoder 742 selects one or more word lines that need erase inhibition such that an inhibition voltage (for example, $V_I$ of FIG. 5B) is selectively provided to the word lines. The string drivers 750 supply an erase voltage (for example, $V_E$ of FIG. 5B) and an inhibition voltage (for example, $V_I$ of FIG. 5B) to the word lines of the memory block according to the selection by the HV x-line decoder 742.

The very high voltage (VHV) generator 760 is configured to provide the substrate of the memory block 710 with a substrate voltage (for example, Vs set forth above in connection with FIG. 5B) during an erase or re-erase operation. In one embodiment, the substrate voltage supplied by the VHV generator 760 may be about +20 V or higher. A skilled artisan will appreciate that the substrate voltage can vary widely, depending on the design of the NAND flash memory device.

Figure 8:
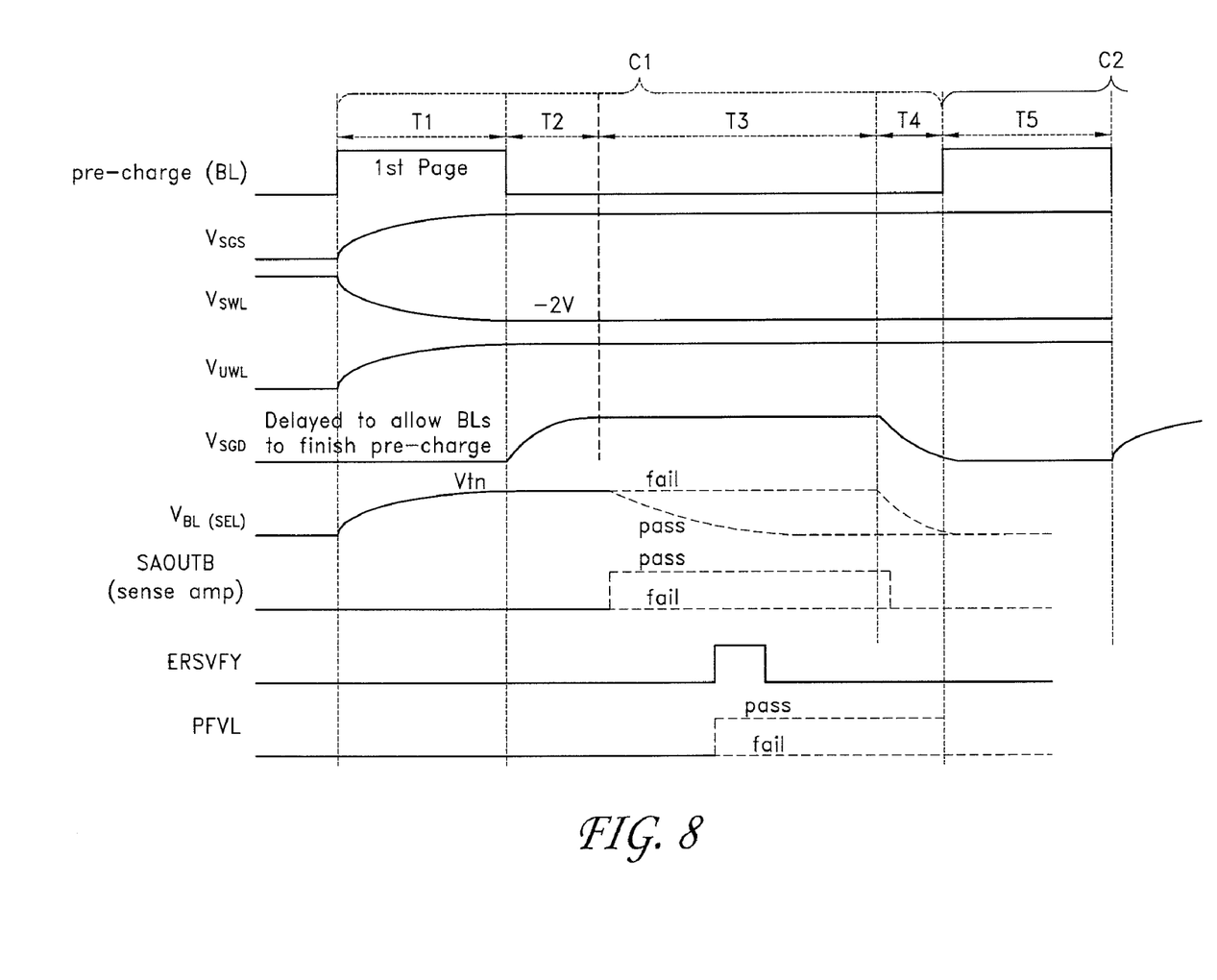
FIG. 8 is a timing diagram illustrating an erase verification method according to one embodiment.

Referring to FIGS. 7 and 8, an erase verification/re-erase operation for the NAND flash memory device 700 according to one embodiment will be described below. In the illustrated embodiment, erase verification is performed on a page basis for the memory block 710. As described above, the memory block 710 includes four pages on a single word line.

FIG. 8 is a timing diagram illustrating erase verification on a memory cell of a bit line on a first page. First, the bit line is pre-charged for a first time period T1 along with other bit lines on the first page. In the illustrated embodiment, the first time period T1 is about 6 µs, but a skilled artisan will appreciate that the first time period T1 can vary widely depending on the design of the NAND flash memory device.

The gate of the lower bit line select transistor (for example, 120b of FIG. 1) of the bit line is provided with $V_{SGS}$. $V_{SGS}$ increases during the first time period T1 and is maintained at a "high" level for the erase verification for the four pages of the same word line.

A select voltage $V_{SWL}$ is applied to a word line that is being erase verified while an unselect voltage $V_{UWL}$ to fully turn on a memory cell is applied to all the other word lines in the memory block 710. In the illustrated embodiment, the select voltage $V_{SWL}$ is substantially equal to the threshold voltage of an erased memory cell. The select voltage $V_{SWL}$ gradually decreases during the first time period T1, and is maintained at a level, for example, −2V, for the erase verification for the four pages of the same word line. The other word lines that are not being erase-verified are provided with the unselect voltage $V_{UWL}$, as described above in connection with FIG. 4B. The unselect voltage $V_{UWL}$ gradually increases during the first time period T1, and is maintained at a level, for example, +6V, during the erase verification for the four pages of the same word line.

The gate of the upper bit line select transistor (for example, 120a of FIG. 1) of the bit line is provided with $V_{SGD}$. $V_{SGD}$ increases for a second time period T2 which is immediately after the first time period T1. $V_{SGD}$ starts to increase after the first time period T1 to allow the bit lines to finish precharging. $V_{SGD}$ is maintained at a "high" level for a third time period T3. A total of the second and third time periods T2, T3 may be less than about 10 µs, but a skilled artisan will appreciate that each of the second and third time periods T2 and T3 can vary widely depending on the design of the NAND flash memory device. $V_{SGD}$ is reduced during a fourth time period T4 that lasts about 3 µs after the third time period T3. A skilled artisan will appreciate that the fourth time periods T4 can vary widely depending on the design of the NAND flash memory device.

The bit line voltage $V_{BL}$ (for example, the first bit line voltage at the first node N1 of FIG. 4A) increases during the first time period T1 as the bit line BL is pre-charged. The bit line voltage $V_{BL}$ is maintained at Vtn during the second time period T2. During the third time period T3, if the bit line voltage $V_{BL}$ is still maintained at Vtn, it indicates that the memory cell coupled to the bit line has failed erase verification. By contrast, if the bit line voltage $V_{BL}$ decreases from Vtn, it indicates that the memory cell coupled to the bit line has passed erase verification.

The sense amplifier 722 detects a current from the bit line via the multiplexer block 721, and outputs a current signal SAOUTB indicative of whether the memory cell has passed or failed the erase verification.

Subsequently, an erase verify signal ERSVFY is provided by the state machine 731 within the third time period T3 to enable the verify latch 723. Upon receiving the erase verify signal ERSVFY, the verify latch 723 latches the current signal SAOUTB and outputs a pass/fail signal PFVL to the column selector 724. The pass/fail signal PFVL is cleared upon receiving an erase verify check signal ersvfy chk from the state machine 731 for erase verification for a next page. The pass/fail signal PFVL is cleared before a fifth time period T5 immediately following the fourth time period T4.

The column selector 724 provides the pass/fail counter 725 with the pass/fail signals PFVL one by one for individual memory cells of a page of the word line. The pass/fail counter 725 counts the number of failed or passed memory cells, and provides the number to the state machine 731 as the fail count signal FAIL_COUNT. In the illustrated embodiment where a word line includes four pages, the first to fourth periods T1-T4 form a cycle for a page of a word line. The same or similar cycles are repeated for the other three pages. In certain embodiments, if any of the pages fails erase verification, erase verification for the other pages of the same word line may be skipped, and erase verification for the next word line may be performed.

Based on the number of failed or passed memory cells from the four cycles for the four pages of a word line, the state machine 731 determines whether the number exceeds a selected threshold, as described above in connection with FIG. 5A. For example, if the number of failed memory cells coupled to a word line exceeds the threshold, the state machine 731 sets the word line to have failed erase verification, and stores the information in the word line inhibition register 732. This process is repeated for the remainder of the word lines in the memory block 710. The inhibition register 732 is set to selectively perform erase inhibition on the word lines of the memory block 710 during a re-erase operation.

When all the word lines have not passed the erase verification, the state machine 731 controls the HV generator 741 to generate a voltage for erase inhibition. The HV generator 741 provides the voltage to the HV x-line decoder 742. The HV x-line decoder 742 provides the voltage to the string drivers 750 based at least partly on the selection by the word line inhibition register 732.

The string drivers 750 selectively provide erase inhibition voltages (for example, $V_E$ of FIG. 5B) and erase voltages (for example, $V_I$ of FIG. 5B) to the word lines of the memory block 710. The VHV generator 760 provides a substrate voltage to the substrate of the memory block 710, thereby performing a re-erase operation.

In certain embodiments, another erase verification process can be performed after the re-erase operation, as described earlier in connection with FIG. 6. In such embodiments, erase verification may be skipped for erase-inhibited word lines after the re-erase operation.

The process described above can be repeated until there is no failed word line. However, the process may be terminated if there is still a failed word line after repeating a selected number of such processes, as set forth above in connection of block 640 of FIG. 6. Subsequently, a sequential verification process may be performed as in block 680 of FIG. 6, as set forth below.

In the process described above in connection with FIGS. 4A and 4B, a word line voltage (hereinafter, referred to as "erase verify voltage") for erase verifying a memory cell is about −2 V. If a certain memory cell coupled to a word line keeps failing erase verification after a selected number of re-erase processes, the erase verify voltage for the word line may be increased, for example, to about −1 V. If the word line still fails with this increased erase verify voltage, the erase verify voltage may be further increased, for example, to 0 V, incrementally until the word line passes the erase verification.

Information on whether the entire memory block passes or fails erase verification with increased erase verify voltages may be stored in a status register (not shown) or any suitable non-volatile memory (for example, a ROM or another NAND memory block) of the NAND flash memory device, as shown in Table 1. In Table 1, the numbers in the erase verify voltage column represent erase verify voltages in the parentheses.

TABLE 1

| Erase Verify Voltage | Pass (0)/Fail (1) |
| --- | --- |
| 0 (−3 V) | 1 |
| 1 (−2 V) | 1 |
| 2 (−1 V) | 0 |
| 3 (0 V) | 0 |

The information stored in the status register indicates the worst case threshold voltage. The information may be used for the programming of memory cells in subsequent operations. For example, when performing a write operation, the controller of the NAND flash memory device can obtain information on the erase verify value of a memory block from the status register, and adjust the number of bits stored in the memory cells of the memory block. In an embodiment where memory blocks including multi-level cells (for example, each cell stores 3 data bits) are designed to pass erase verification with an erase verify voltage of −2 V, if a memory block passes erase verification only with an erase verify voltage greater than −1V, the memory cells of the memory block may be used as single level cells (for example, each cell stores 1 data bit). A skilled artisan will appreciate that such information can be used in various manners for adjusting the operation of the NAND flash memory device.

The erase verify scheme of the embodiments described above provide accurate erase verification of individual memory cells, compared to the conventional method of FIGS. 3A and 3B. In addition, the erase verification/inhibition schemes can narrow the distribution of the threshold voltages of erased memory cells, thereby reducing programming stress on memory cells. Ultimately, the embodiments can enhance the overall life of the memory cells by preventing unnecessary erasure.

The embodiments above are described in the context of NAND flash memory devices. A skilled artisan will, however, appreciate that the embodiments can also be adapted for any other types of memory devices having the same or similar problems.

A flash memory device according to the embodiments described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, etc. Further, the electronic device can include unfinished products.

One embodiment is a method of erasing a memory block in a flash memory device comprising one or more memory blocks. The memory block includes a plurality of data lines, a plurality of access lines, and a plurality of memory cells. The method includes performing erase verification on the memory cells, one memory cell by one memory cell. The erase verification includes determining whether the individual memory cells coupled to at least one of the data lines of the memory block have been erased. The method further includes re-erasing the memory cells coupled to one or more of the access lines of the memory block, wherein the one or more of the access lines are selected based at least partly on the result of the erase verification.

Another embodiment is a method of erase verification for a flash memory device. The flash memory device includes a memory block including a plurality of data lines, a plurality of access lines, and a plurality of memory cells of the data lines. Each of the memory cells includes a floating gate transistor including a control gate. Each of the control gates of the floating gate transistors is electrically coupled to a respective one of the access lines. The method includes: applying a first voltage to one of the access lines of the memory block. The first voltage is substantially equal to a threshold voltage of the floating gate transistor of an erased memory cell. The method also includes applying a second voltage to the other access lines of the memory block to substantially fully turn on the floating gate transistors of the memory cells coupled to the other access lines. The second voltage is higher than the first voltage. The method further includes detecting a current flowing from at least one of the memory cells coupled to the one of the access lines.

Yet another embodiment is an apparatus including: a flash memory array comprising a plurality of memory blocks. Each of the memory blocks includes: a plurality of data lines; a plurality of access lines; and a plurality of memory cells of the data lines. Each of the memory cells includes a floating gate transistor including a control gate. Each of the control gates of the floating gate transistors is electrically coupled to a respective one of the access lines. The apparatus further includes a block erase circuit responsive to a block erase command. The block erase circuit is configured to erase all the memory cells of a selected memory block. The block erase circuit is further configured to perform erase verification comprising determining whether the individual memory cells coupled to one of the data lines have been erased one memory cell by one memory cell. The block erase circuit is further configured to perform a re-erase operation on the memory cells coupled to one or more of the access lines of the selected memory block, the one or more of the access lines being selected based at least partly on the result of the erase verification.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

We claim:

1. A method of erasing a memory block in a flash memory device comprising one or more memory blocks, wherein the memory block comprises a plurality of data lines, a plurality of access lines, and a plurality of memory cells, the method comprising:
    performing erase verification on the memory cells, one memory cell by one memory cell, the erase verification comprising determining whether the individual memory cells coupled to at least one of the data lines of the memory block have been erased;
    identifying access lines of the memory block having a predetermined number or more of unerased memory cells; and
    re-erasing only the memory cells coupled to the identified access line.

2. A method of erasing a memory block in a flash memory device comprising one or more memory blocks, wherein the memory block comprises a plurality of data lines, a plurality of access lines, and a plurality of memory cells, the method comprising:
    performing erase verification on the memory cells, one memory cell by one memory cell, the erase verification comprising determining whether the individual memory cells coupled to at least one of the data lines of the memory block have been erased; and
    re-erasing the memory cells coupled to one or more of the access lines of the memory block, wherein the one or more of the access lines are selected based at least partly on the result of the erase verification,
    wherein each of the memory cells comprises a floating gate transistor including a control gate, the control gate of each of the floating gate transistors being electrically coupled to a respective one of the access lines, and wherein performing the erase verification comprises:
    providing a first voltage to one of the access lines of the memory block, the first voltage being substantially equal to a desired threshold voltage of the floating gate transistor of an erased memory cell; and
    providing a second voltage to the other access lines of the memory block to substantially fully turn on the floating gate transistors of the memory cells coupled to the other access lines, the second voltage being higher than the first voltage.

3. The method of claim 2, wherein performing the erase verification further comprises determining if at least one of the memory cells coupled to the one of the access lines is at least partially turned on by the first voltage.

4. The method of claim 3, wherein determining if at least one of the memory cells is at least partially turned on comprises detecting a current flowing from the at least one of the memory cells.

5. The method of claim 2, wherein performing the erase verification comprises simultaneously erase verifying two or more of the memory cells coupled to the one access line.

6. The method of claim 2, wherein performing the erase verification comprises simultaneously erase verifying a page of memory cells coupled to the one access line.

7. The method of claim 5, further comprising:
    counting a number of unerased memory cells coupled to the one access line, the unerased memory cells being memory cells that have been determined to be unerased by the erase verification; and
    determining whether the number of the unerased memory cells is less than a selected number.

8. The method of claim 7, wherein re-erasing the memory cells comprises:
    providing a third voltage to at least one of the access lines of the memory block, the at least one of the access lines including a number of unerased memory cells, the number being smaller than the selected number, the third voltage being configured to substantially inhibit erasure of memory cells coupled to the at least one of the access lines; and
    providing a fourth voltage to the other access lines of the memory block, the fourth voltage being configured to erase memory cells coupled to the other access lines.

9. The method of claim 8, wherein the third voltage is higher than the fourth voltage.

10. The method of claim 2, further comprising:
    providing a fifth voltage to one of the access lines of the memory block, the fifth voltage being higher than the first voltage and lower than the second voltage;
    providing a sixth voltage to the other access lines of the memory block to substantially fully turn on the floating gate transistors of the memory cells coupled to the other access lines, the sixth voltage being higher than the fifth voltage;
    determining whether at least one of the memory cells coupled to the one of the access lines is turned on by the fifth voltage; and
    storing information on whether the at least one of the memory cells coupled to the one of the access lines is turned on by the fifth voltage.

11. The method of claim 10, further comprising adjusting programming of the at least one of the memory cells based at least partly on the stored information.

12. A method of erase verification for a flash memory device, wherein the flash memory device comprises a memory block including a plurality of data lines, a plurality of access lines, and a plurality of memory cells, each of the memory cells comprising a floating gate transistor including a control gate, each of the control gates of the floating gate transistors being electrically coupled to a respective one of the access lines, the method comprising:
    applying a first voltage to one of the access lines of the memory block, the first voltage being substantially equal to a threshold voltage of the floating gate transistor of an erased memory cell;
    applying a second voltage to the other access lines of the memory block to substantially fully turn on the floating gate transistors of the memory cells coupled to the other access lines, the second voltage being higher than the first voltage; and detecting a current flowing from at least one of the memory cells coupled to the one of the access lines.

13. An apparatus comprising:
a flash memory array comprising a plurality of memory blocks, each of the memory blocks comprising:
  a plurality of data lines;
  a plurality of access lines; and
  a plurality of memory cells of the data lines, each of the memory cells comprising a floating gate transistor including a control gate, each of the control gates of the floating gate transistors being electrically coupled to a respective one of the access lines; and
a block erase circuit responsive to a block erase command, the block erase circuit being configured to erase all the memory cells of a selected memory block,
wherein the block erase circuit is further configured to perform erase verification comprising determining whether the individual memory cells coupled to at least one of the data lines have been erased one memory cell by one memory cell,
wherein the block erase circuit is further configured to identify access lines of the memory block having a predetermined number or more of unerased memory cells, and
wherein the block erase circuit is further configured to perform a re-erase operation only on the memory cells coupled to the identified access line.

14. An apparatus comprising:
a flash memory array comprising a plurality of memory blocks, each of the memory blocks comprising:
  a plurality of data lines;
  a plurality of access lines; and
  a plurality of memory cells of the data lines, each of the memory cells comprising a floating gate transistor including a control gate, each of the control gates of the floating gate transistors being electrically coupled to a respective one of the access lines; and
a block erase circuit responsive to a block erase command, the block erase circuit being configured to erase all the memory cells of a selected memory block,
wherein the block erase circuit is further configured to perform erase verification comprising determining whether the individual memory cells coupled to one of the data lines have been erased one memory cell by one memory cell;
wherein the block erase circuit is further configured to perform a re-erase operation on the memory cells coupled to one or more of the access lines of the selected memory block, the one or more of the access lines being selected based at least partly on the result of the erase verification;
wherein the block erase circuit is further configured to provide a first voltage to one of the access lines of the memory block, the first voltage being substantially equal to a desired threshold voltage of the floating gate transistor of an erased memory cell; and
wherein the block erase circuit is further configured to provide a second voltage to the other access lines of the memory block to substantially fully turn on the floating gate transistors of the memory cells coupled to the other access lines, the second voltage being higher than the first voltage.

15. The apparatus of claim 14, wherein the block erase circuit comprises a verify latch configured to determine if at least one of the memory cells coupled to the one of the access lines is at least partially turned on by the first voltage.

16. The apparatus of claim 15, wherein the block erase circuit further comprises a sense amplifier configured to detect a current flowing from the at least one of the memory cells.

17. The apparatus of claim 15, wherein the verify latch is configured to simultaneously erase verify two or more of the memory cells coupled to the one access line.

18. The apparatus of claim 17, wherein the verify latch is configured to simultaneously erase verifying a page of memory cells coupled to the one access line.

19. The apparatus of claim 17, wherein the block erase circuit further comprises a counter configured to count a number of unerased memory cells coupled to the one access line, the unerased memory cells being memory cells that have been determined to be unerased by the erase verification, wherein the block erase circuit is further configured to determine whether the number of the unerased memory cells is less than a selected number.

20. The apparatus of claim 19, wherein the block erase circuit further comprises a register configured to store information on whether one or more of the access lines include a number of unerased memory cells, the number being smaller than the selected number.

21. The apparatus of claim 19, wherein the re-erase operation comprises:
providing a third voltage to one or more of the access lines of the memory block, the one or more access lines including a number of unerased memory cells, the number being smaller than the selected number, the third voltage being configured to substantially inhibit erasure of memory cells coupled to the one or more access lines; and
providing a fourth voltage to the other access lines of the memory block, the fourth voltage being configured to erase memory cells coupled to the other access lines.

22. The apparatus of claim 21, wherein the third voltage is higher than the fourth voltage.

23. The apparatus of claim 15, wherein the block erase circuit is further configured to provide a fifth voltage to one of the access lines of the memory block, the fifth voltage being higher than the first voltage and lower than the second voltage, and to provide a sixth voltage to the other access lines of the memory block to substantially fully turn on the floating gate transistors of the memory cells coupled to the other access lines, the sixth voltage being higher than the fifth voltage;
wherein the verify latch is further configured to determine whether at least one of the memory cells coupled to the one of the access lines is turned on by the fifth voltage; and
wherein the apparatus further comprises a status register configured to store information on whether the at least one of the memory cells coupled to the one of the access lines is turned on by the fifth voltage.

24. The apparatus of claim 23, wherein the block erase circuit is further configured to adjust programming of the at least one of the memory cells based at least partly on the stored information.

* * * * *